US008659069B2

(12) United States Patent
Kim et al.

(10) Patent No.: US 8,659,069 B2
(45) Date of Patent: Feb. 25, 2014

(54) GATE STRUCTURES

(75) Inventors: Jung-Hwan Kim, Seoul (KR); Sung-Ho Heo, Suwon-si (KR); Jae-Ho Choi, Busan (KR); Hun-Hyeong Lim, Hwaseong-si (KR); Ki-Hyun Hwang, Seongnam-si (KR); Woo-Sung Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/340,968

(22) Filed: Dec. 30, 2011

(65) Prior Publication Data
US 2012/0187470 A1    Jul. 26, 2012

(30) Foreign Application Priority Data

Jan. 24, 2011  (KR) .................. 10-2011-0006617

(51) Int. Cl.
*H01L 29/788*    (2006.01)
(52) U.S. Cl.
USPC .............. 257/321; 257/E29.042; 257/326; 257/316; 257/314; 257/315; 257/317; 257/318; 257/319; 257/320; 257/322; 257/323; 257/324; 257/325; 257/327; 438/261; 438/257; 438/260; 438/264; 438/265
(58) Field of Classification Search
USPC .......................................... 257/321, E29.042
See application file for complete search history.

(56) References Cited

U.S. PATENT DOCUMENTS

| | | | | |
|---|---|---|---|---|
| 6,831,326 | B1 * | 12/2004 | Hsieh .............................. | 257/315 |
| 7,297,597 | B2 * | 11/2007 | Dong et al. ................... | 438/261 |
| 7,485,918 | B2 | 2/2009 | Yamamoto et al. | |
| 7,612,404 | B2 * | 11/2009 | Yamamoto et al. ........... | 257/321 |
| 7,842,570 | B2 * | 11/2010 | Fayrushin et al. ............ | 438/257 |
| 2005/0266640 | A1 | 12/2005 | You et al. | |
| 2007/0262372 | A1 * | 11/2007 | Yamamoto et al. ........... | 257/324 |
| 2009/0096016 | A1 * | 4/2009 | Kwon .......................... | 257/324 |
| 2010/0248467 | A1 * | 9/2010 | Kim et al. ..................... | 438/593 |
| 2012/0126299 | A1 * | 5/2012 | Matsuo et al. ................ | 257/296 |
| 2013/0069135 | A1 * | 3/2013 | Nakahara et al. ............. | 257/316 |
| 2013/0069142 | A1 * | 3/2013 | Matsuo et al. ................ | 257/326 |

FOREIGN PATENT DOCUMENTS

| | | |
|---|---|---|
| JP | 2003-031705 A | 1/2003 |
| JP | 2007-305668 A | 11/2007 |
| KR | 10-2005-0113793 A | 12/2005 |

* cited by examiner

*Primary Examiner* — Matthew W Such
*Assistant Examiner* — Samuel Lair
(74) *Attorney, Agent, or Firm* — Lee & Morse, P.C.

(57) ABSTRACT

A method of forming a gate structure includes forming a tunnel insulation layer pattern on a substrate, forming a floating gate on the tunnel insulation layer pattern, forming a dielectric layer pattern on the floating gate, the dielectric layer pattern including a first oxide layer pattern, a nitride layer pattern on the first oxide layer pattern, and a second oxide layer pattern on the nitride layer pattern, the second oxide layer pattern being formed by performing an anisotropic plasma oxidation process on the nitride layer, such that a first portion of the second oxide layer pattern on a top surface of the floating gate has a larger thickness than a second portion of the second oxide layer pattern on a sidewall of the floating gate, and forming a control gate on the second oxide layer.

10 Claims, 12 Drawing Sheets

GATE STRUCTURES

CROSS-REFERENCE TO RELATED APPLICATION

This application claims priority under 35 USC §119 to Korean Patent Application No. 10-2011-0006617 filed on Jan. 24, 2011 in the Korean Intellectual Property Office (KIPO), the contents of which are herein incorporated by reference in their entirety.

BACKGROUND

1. Field

Example embodiments relate to gate structures, methods of manufacturing gate structures, and methods of manufacturing semiconductor devices using the same. More particularly, example embodiments relate to gate structures having a floating gate and a dielectric layer, methods of manufacturing gate structures having a floating gate and a dielectric layer, and methods of manufacturing semiconductor devices using the same.

2. Description of the Related Art

Recently, as semiconductor devices have been highly integrated, an aspect ratio of a gate structure became larger. Accordingly, the electrical characteristics of the gate structure were affected.

SUMMARY

Example embodiments provide a method of forming a gate structure having good electrical characteristics.

Example embodiments provide a gate structure having good electrical characteristics.

Example embodiments provide a method of forming a semiconductor device including a gate structure having good electrical characteristics.

Example embodiments may provide a method of forming a gate structure, the method including forming a tunnel insulation layer pattern on a substrate, forming a floating gate on the tunnel insulation layer pattern, forming a dielectric layer pattern on the floating gate, the dielectric layer pattern including a first oxide layer pattern, a nitride layer pattern on the first oxide layer pattern, and a second oxide layer pattern on the nitride layer pattern, the second oxide layer pattern being formed by performing an anisotropic plasma oxidation process on the nitride layer, such that a first portion of the second oxide layer pattern on a top surface of the floating gate has a larger thickness than a second portion of the second oxide layer pattern on a sidewall of the floating gate, and forming a control gate on the second oxide layer.

The anisotropic plasma oxidation process may be performed under a low pressure equal to or lower than about 1 Torr.

The anisotropic plasma oxidation process may be performed using at least one of oxygen, ozone, nitric oxide, and nitrous oxide.

The anisotropic plasma oxidation process may be performed by applying a bias to the substrate to improve uniformity of the plasma.

Performing the anisotropic plasma oxidation process may include a higher degree of oxidation of a portion of the nitride layer on the top surface of the floating gate than a portion of the nitride layer on the sidewall of the floating gate.

A method of forming a semiconductor device with a gate structure may further include sequentially forming a preliminary tunnel insulation layer pattern and a preliminary floating gate on the substrate, sequentially forming a first oxide layer and a nitride layer on the preliminary floating gate, performing an anisotropic plasma oxidation process on the nitride layer to form a second oxide layer on the nitride layer, a portion of the second oxide layer on the top surface of the preliminary floating gate having a thickness substantially larger than a thickness of a portion of the second oxide layer on the sidewall of the preliminary floating gate, forming a control gate layer on the second oxide layer, and patterning the control gate layer, the second oxide layer, the nitride layer, the first oxide layer, the preliminary floating gate, and the preliminary tunnel insulation layer pattern to form a gate structure including the tunnel insulation layer pattern, the floating gate, the first oxide layer pattern, the nitride layer pattern, the second oxide layer pattern, and the control gate sequentially stacked on the substrate.

Forming the preliminary tunnel insulation layer pattern and the preliminary floating gate may include sequentially forming a tunnel insulation layer, a floating gate layer, and a first mask on the substrate, and patterning the floating gate layer and the tunnel insulation layer using the first mask as an etching mask.

A plurality of preliminary tunnel insulation layer patterns and a plurality of preliminary floating gates may be formed along a second direction substantially parallel to a top surface of the substrate, and each of the preliminary tunnel insulation layer patterns and each of the preliminary floating gates extend along a first direction substantially perpendicular to the second direction.

Patterning the control gate layer, the second oxide layer, the nitride layer, the first oxide layer, the preliminary floating gate, and the preliminary tunnel insulation layer pattern may include forming a second mask on the control gate layer to serve as an etching mask.

Example embodiments may also provide a method of forming a gate structure, the method including forming a tunnel insulation layer pattern on a substrate, forming a floating gate on the tunnel insulation layer pattern, such that the floating gate has a smaller top width than a bottom width, conformally forming a dielectric layer pattern on the floating gate by sequentially forming a first oxide layer pattern, a nitride layer pattern, and a second oxide layer pattern on the floating gate, the second oxide layer pattern being thicker on a top surface of the floating gate than on a sidewall thereof, and forming a control gate on the second oxide layer.

Forming the second oxide layer pattern may include performing an anisotropic plasma oxidation process on the nitride layer.

Forming the dielectric layer may include performing the anisotropic plasma oxidation process at a low pressure.

Forming the dielectric layer may include forming a layer with an equivalent oxide thickness that is larger at the top of the floating gate than at a sidewall thereof.

Example embodiments may also provide a gate structure, including a tunnel insulation layer pattern on a substrate, a floating gate on the tunnel insulation layer pattern, a dielectric layer pattern on the floating gate, the dielectric layer pattern including a first oxide layer pattern, a nitride layer pattern on the first oxide layer pattern, and a second oxide layer pattern on the nitride layer pattern, a first portion of the second oxide layer pattern on a top surface of the floating gate having a larger thickness than a second portion of the second oxide layer pattern on a sidewall of the floating gate, and a control gate on the dielectric layer pattern.

A first portion of the nitride layer pattern on the top surface of the floating gate may have a smaller thickness than a second portion of the nitride layer pattern on the sidewall of the floating gate, the first portions of the nitride layer and second oxide layer overlapping each other.

The floating gate may have a smaller top width than a bottom width, the first portion of the second oxide layer pattern overlapping the top width of the floating gate.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
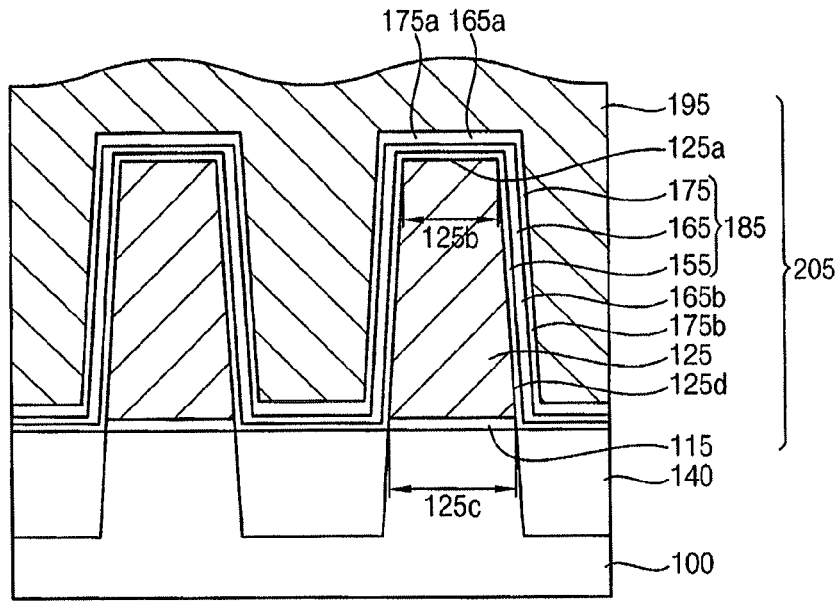
FIGS. 1 and 2 illustrate cross-sectional views of a gate structure in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Further, it will be understood that when an element or layer is referred to as being "connected to" or "coupled to" another layer, it can be directly connected or coupled to the other layer or intervening layers may be present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
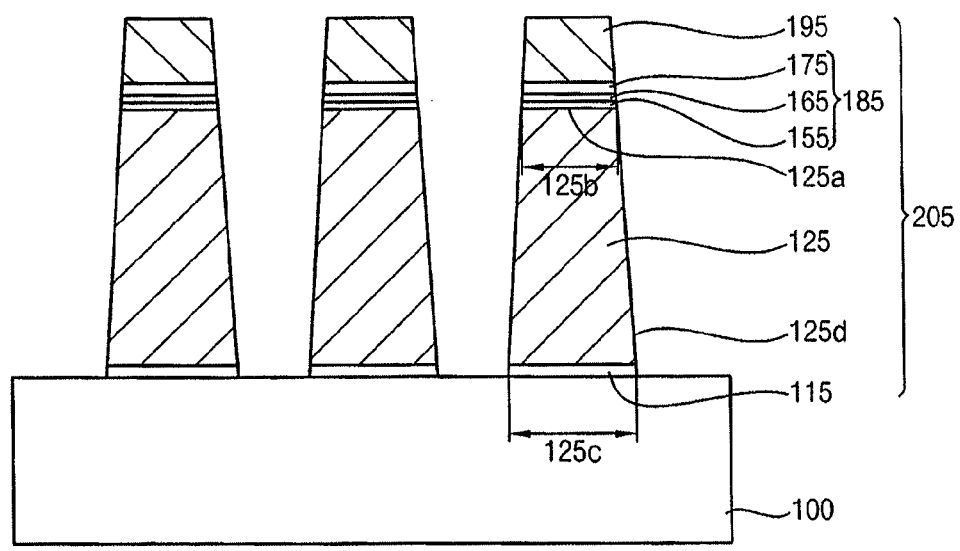

Hereinafter, a gate structure according to example embodiments will be explained in detail with reference FIGS. 1 and 2. FIGS. 1 and 2 are cross-sectional views of a gate structure in accordance with example embodiments. FIG. 1 is a cross-sectional view of the gate structure cut along a second direction, and FIG. 2 is a cross-sectional view of the gate structure cut along a first direction substantially perpendicular to the second direction.

Referring to FIGS. 1 and 2, a gate structure 205 may include a tunnel insulation layer pattern 115, a floating gate 125, a dielectric layer pattern 185, and a control gate 195 sequentially stacked on a substrate 100 having an isolation layer 140 thereon. In example embodiments, a plurality of gate structures 205 may be formed along the first direction, and each of the gate structures 205 may extend along the second direction.

The substrate 100 may include a semiconductor substrate, e.g., a silicon substrate, a germanium substrate, a silicon-germanium substrate, a silicon-on-insulator (SOI) substrate, a germanium-on-insulator (GOI) substrate, and the like. The substrate 100 may include a well (not shown) having p-type impurities or n-type impurities.

The substrate 100 may be divided into an active region and a field region by the isolation layer 140. That is, a region in which the isolation layer 140 is formed may be defined as the field region, and a region in which the isolation layer 140 is not formed may be defined as the active region. The isolation layer 140 may include oxide. For example, the isolation layer 140 may include boro silicate glass (BSG), boro phospho silicate glass (BPSG), undoped silicate glass (USG), spin on glass (SOG), flowable oxide (FOX), tetra ethyl ortho silicate (TEOS), high density plasma (HDP), and the like. In example embodiments, the isolation layer 140 may extend along the first direction, so that the field region or the active region may extend along the first direction.

The tunnel insulation layer pattern 115 may include an oxide, e.g., silicon oxide, an oxynitride, e.g., silicon oxynitride, a low-k dielectric material, and the like. In example embodiments, the tunnel insulation layer pattern 115 may be formed on the active region, and a plurality of tunnel insulation layer patterns 115 having an island shape from each other may be formed along the first direction. In other example embodiments, the tunnel insulation layer pattern 115 may be formed not only on the active region, but also on the field region.

The floating gate 125 may include doped polysilicon or a metal having a high work function, e.g., tungsten (W), titanium (Ti), cobalt (Co), nickel (Ni), etc. The floating gate 125 may be formed on the tunnel insulation layer pattern 115. In example embodiments, a plurality of floating gates 125 having an island shape from each other may be formed along the first direction. The floating gate 125 may have a high aspect ratio substantially equal to or more than about 5:1. In an example embodiment, the floating gate 125 may have a sharp top surface 125a, i.e., a width of the floating gate 125 may decrease along each of the first and second directions as a distance from the substrate 100 increases. For example, a top width 125b of the floating gate 125 along the first direction may be smaller than a bottom width 125c of the floating gate along the first direction.

The dielectric layer pattern 185 may include a first oxide layer pattern 155, a nitride layer pattern 165, and a second oxide layer pattern 175 sequentially stacked on the floating gate 125. The dielectric layer pattern 185 may be formed, e.g., conformally, on a top surface, i.e., a surface substantially parallel to the substrate 100, and a sidewall, i.e., a surface contacting the top surface and at an angle other than 180 degrees with respect to the top surface, of the floating gate 125 and on the tunnel insulation layer pattern 115. In example embodiments, the dielectric layer pattern 185 may extend along the second direction, and thus the dielectric layer pattern 185 may be also formed on a top surface of the isolation layer 140 between the floating gates 125. In example embodiments, a plurality of dielectric layer patterns 185 may be formed along the first direction. For example, each dielectric layer pattern 185 may extend continuously along the second direction to cover a plurality of floating gates 125 along the second direction, and may be separated from an adjacent dielectric layer pattern 185 along the first direction.

The first oxide layer pattern 155 may include an oxide, e.g., silicon oxide, high temperature oxide (HTO), etc., the nitride layer pattern 165 may include a nitride, e.g., silicon nitride, etc., and the second oxide layer pattern 175 may include an oxide, e.g., silicon oxide, etc.

In example embodiments, the first oxide layer pattern 155 may have a substantially uniform thickness on all surfaces of the floating agate 125, i.e., on the top surface and the sidewall of the floating gate 125. In an example embodiment, the first oxide layer pattern 155 may be formed to have a thickness of about 25 Å to about 35 Å.

In example embodiments, a first portion 165a of the nitride layer pattern 165 on the top surface 125a of the floating gate 125 may have a thickness substantially smaller than a thickness of a second portion 165b of the nitride layer pattern 165 on the sidewall 125d of the floating gate 125. For example, the second portion of the nitride layer pattern 165 on the sidewall of the floating gate 125 may be formed to have a thickness of about 30 Å to about 50 Å, and the first portion of the nitride layer pattern 165 on the top surface of the floating gate 125 may be formed to have a thickness of about 20 Å to about 40 Å.

In example embodiments, a first portion 175a of the second oxide layer pattern 175 on the top surface 125a of the floating gate 125 may have a thickness larger than a thickness of a second portion 175b of the second oxide layer pattern 175 on the sidewall 125d of the floating gate 125. For example, the second portion 175b of the second oxide layer pattern 175 on the sidewall of the floating gate 125 may be formed to have a thickness of about 20 Å to about 40 Å, and the first portion of the second oxide layer pattern 175 on the top surface of the floating gate 125 may be formed to have a thickness of about 30 Å to about 50 Å.

Thus, a portion of the dielectric layer pattern 185 on the top surface of the floating gate 125 may have a relatively small thickness of the nitride layer pattern 165 and a relatively large thickness of the second oxide layer pattern 175, when compared to a portion of the dielectric layer pattern 185 on the sidewall of the floating gate 125. As a result, the portion of the dielectric layer pattern 185 on the top surface of the floating gate 125 may have a high equivalent oxide thickness (EOT), so that an electric field may not be concentrated thereon, even though the floating gate 125 has a sharp top surface 125a.

The control gate 195 may include doped polysilicon, a metal, a metal nitride, a metal silicide, and the like. In an example embodiment, the control gate 195 may include a doped polysilicon layer, an ohmic layer, a diffusion barrier layer, an amorphous layer and a metal layer sequentially stacked. For example, the ohmic layer may have titanium (Ti), tantalum (Ta), tungsten (W), molybdenum (Mo) or an alloy thereof. The amorphous layer may include a refractory metal silicide, e.g., amorphous tungsten silicide ($WSi_x$), amorphous titanium silicide ($TiSi_x$), amorphous molybdenum silicide ($MoSi_x$), or amorphous tantalum silicide ($TaSi_x$). The metal layer may include, e.g., tungsten, titanium, tantalum, molybdenum, or an alloy thereof. The control gate 195 may be formed on the dielectric layer pattern 185. In example embodiments, the control gate 195 may extend along the second direction, and a plurality of control gates 195 may be formed to be spaced apart along the first direction.

As illustrated above, the gate structure 205 may include the floating gate 125 having a high aspect ratio and a narrow upper portion or a sharp top surface. However, the portion of the dielectric layer pattern 185 on the top surface of the floating gate 125 may have an EOT substantially larger than that of the portion of the dielectric layer pattern 185 on the sidewall of the floating gate 125. Thus, the electric field may not be concentrated in the top of the gate structure 205. As a result, the gate structure 205 may have good electrical characteristics.

FIGS. 3 to 7 are cross-sectional views illustrating a method of manufacturing a gate structure in accordance with example embodiments.

Figure 3:
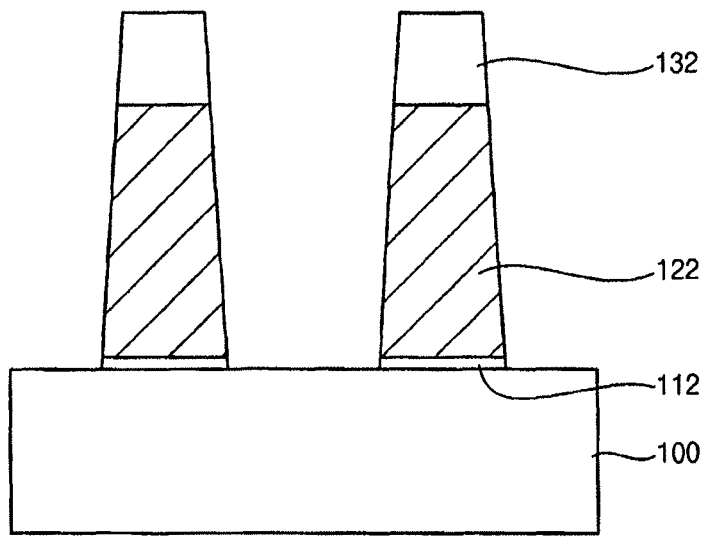
FIGS. 3 to 7 illustrate cross-sectional views of stage in a method of manufacturing a gate structure in accordance with example embodiments.

Referring to FIG. 3, a tunnel insulation layer, a floating gate layer and a first mask layer may be sequentially formed on a substrate 100.

In an example embodiment, the tunnel insulation layer may be formed by oxidizing a top surface of the substrate 100. In another example embodiment, the tunnel insulation layer may be formed using an oxide, an oxynitride, or a low-k dielectric material by a chemical vapor deposition (CVD) process, an atomic layer deposition (ALD) process, a physical vapor deposition (PVD) process, and the like.

The floating gate layer may be formed using doped polysilicon or a metal having a high work function, e.g., tungsten (W), titanium (Ti), cobalt (Co), nickel (Ni), etc.

The first mask layer may be formed using a nitride. The first mask layer may be patterned to form a first mask 132 by a photolithography process. In example embodiments, a plurality of first masks 132 may be formed along a second direction substantially parallel to a top surface of the substrate 100, and each first mask 132 may extend along a first direction substantially perpendicular to the first direction.

The floating gate layer and the tunnel insulation layer may be partially etched using the first mask 132 as an etching mask to form a preliminary floating gate 122 and a preliminary tunnel insulation layer pattern 112, respectively. Thus, each of the preliminary tunnel insulation layer pattern 112 and the preliminary floating gate 122 may extend along the first direction. In example embodiments, a plurality of preliminary tunnel insulation layer patterns 112 and a plurality of preliminary floating gates 122 may be formed along the second direction.

Figure 4:
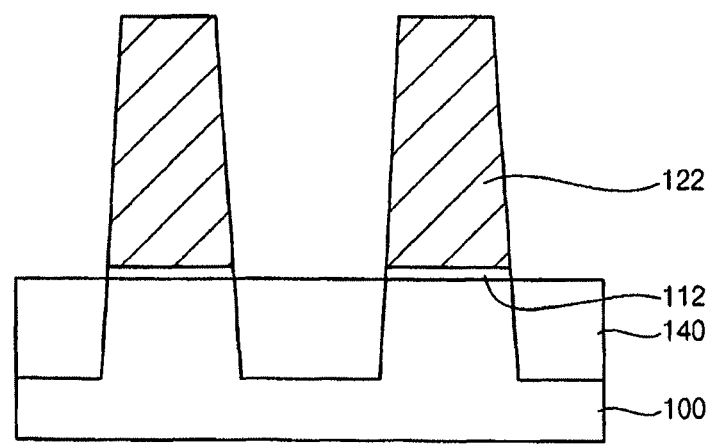

Referring to FIG. 4, an upper portion of the substrate 100 may be etched using the first mask 132, the preliminary floating gate 122, and the preliminary tunnel insulation layer pattern 112 as an etching mask to form a trench (not illustrated). In example embodiments, the trench may extend along the first direction, and a plurality of trenches may be formed along the second direction.

An isolation layer 140 may be formed to fill the trench. In example embodiments, an insulation layer may be formed on the substrate 100 and the first mask 132 to fill the trench and a space between the structures each of which may include the first mask 132, the preliminary floating gate 122, and the preliminary tunnel insulation layer pattern 112. The insulation layer may be planarized until the preliminary floating gate 122 is exposed, and the first mask 132 may be removed. An upper portion of the insulation layer may be removed to form the isolation layer 140 exposing a sidewall of the preliminary floating gate 122. In an example embodiment, the isolation layer 140 may be formed to have a top surface substantially coplanar with a top surface of the substrate 100, thereby exposing also a sidewall of the preliminary tunnel insulation layer pattern 112. In another example embodiment, the isolation layer 140 may be formed to have a top surface substantially coplanar with a top surface of the preliminary tunnel insulation layer pattern 112. The insulation layer may be formed using BSG, BPSG, USG, SOG, FOX, TEOS, HDP, and the like. The insulation layer may be formed by a CVD process, an ALD process, a PVD process, and the like.

In example embodiments, a plurality of isolation layers 140 may be formed along the second direction, and each isolation layer 140 may extend along the first direction. Thus, a plurality of field regions or a plurality of active regions of the substrate 100 may be formed along the second direction, and the field region or the active region of the substrate 100 may extend along the first direction.

Figure 5:
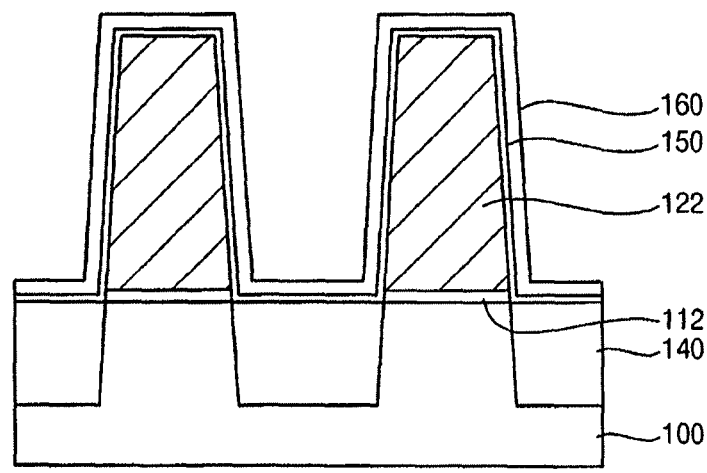

Referring to FIG. 5, a first oxide layer 150 and a nitride layer 160 may be sequentially formed on the substrate 100 and the isolation layer 140 to cover the preliminary floating gate 122 and the preliminary tunnel insulation layer pattern 112.

The first oxide layer 150 may be formed using silicon oxide, HTO, etc. by a CVD process, an ALD process, a low-pressure chemical vapor deposition (LP-CVD) process, etc. In example embodiments, the first oxide layer 150 may be formed to have a substantially uniform thickness. In an example embodiment, the first oxide layer 150 may be formed to have a thickness of about 25 Å to about 35 Å.

The nitride layer 160 may be formed using a nitride, e.g., silicon nitride. The nitride layer 160 may be formed by a CVD process, an ALD process, an LP-CVD process, etc. In example embodiments, the nitride layer 160 may be formed to have a substantially uniform thickness. In an example embodiment, the nitride layer 160 may be formed to have a thickness of about 50 Å to about 65 Å.

Figure 6:
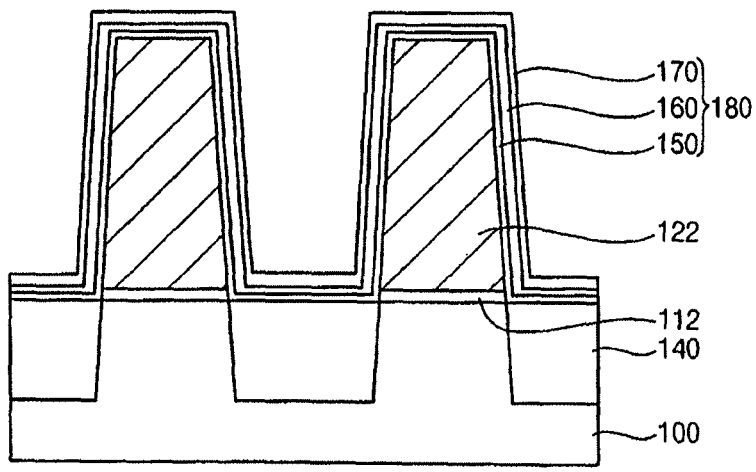

Referring to FIG. 6, a second oxide layer 170 may be formed by an anisotropic plasma oxidation process on the nitride layer 160. That is, a portion of the nitride layer 160 may be oxidized to form the second oxide layer 170, i.e., the nitride layer 160 may have a reduced thickness and the second oxide layer 170 including silicon oxide may be formed on the nitride layer 160.

In example embodiments, the anisotropic plasma oxidation process may be performed using at least one of oxygen ($O_2$), ozone ($O_3$), nitric oxide (NO), and nitrous oxide ($N_2O$). In example embodiments, the anisotropic plasma oxidation process may be performed under a low pressure condition, e.g., pressure equal to or less than about 1 Torr. In a low-pressure plasma oxidation process, oxidation by ions may be more activated than oxidation by radicals, and the ions may be more concentrated on a sharp top surface of a pattern than a sidewall of the pattern. Thus, in the above low-pressure plasma oxidation process, oxidation may be more activated at a portion of the nitride layer 160 on the top surface of the preliminary floating gate 122 than a portion of the nitride layer 160 on the sidewall of the preliminary floating gate 122.

Therefore, a portion of the second oxide layer 170 on the top surface of the preliminary floating gate 122 may be formed to have a thickness substantially larger than that of a portion of the second oxide layer 170 on the sidewall of the preliminary floating gate 122. In an example embodiment, the portion of the second oxide layer 170 on the top surface of the preliminary floating gate 122 may be formed to have a thickness larger than that of the portion of the second oxide layer 170 on the sidewall of the preliminary floating gate 122 by about 5 Å to about 15 Å. In an example embodiment, the portion of the second oxide layer 170 on the sidewall of the preliminary floating gate 122 may be formed to have a thickness of about 20 Å to about 40 Å, and the portion of the second oxide layer 170 on the top surface of the preliminary floating gate 122 may be formed to have a thickness of about 30 Å to about 50 Å.

By the low-pressure plasma oxidation process, a portion of the nitride layer 160 on the top surface of the preliminary floating gate 122 may have a thickness substantially smaller than a portion of the nitride layer 160 on the sidewall of the preliminary floating gate 122. In an example embodiment, the portion of the nitride layer 160 on the top surface of the preliminary floating gate 122 may have a thickness reduced from a thickness of the initial deposition by about 20 Å to about 30 Å, and the portion of the nitride layer 160 on the sidewall of the preliminary floating gate 122 may have a thickness reduced from a thickness of the initial deposition by about 10 Å to about 20 Å. Thus, the portion of the nitride layer 160 on the top surface of the preliminary floating gate 122 may have a thickness of about 20 Å to about 40 Å, and the portion of the nitride layer 160 on the sidewall of the preliminary floating gate 122 may have a thickness of about 30 Å to about 50 Å.

In example embodiments, a plasma oxidation process may be performed by applying a bias to the substrate 100 to improve the straightness, e.g., uniformity, of plasma, so that the anisotropy of the oxidation may be improved.

The first oxide layer 150, the nitride layer 160, and the second oxide layer 170 may define the dielectric layer 180.

Figure 7:
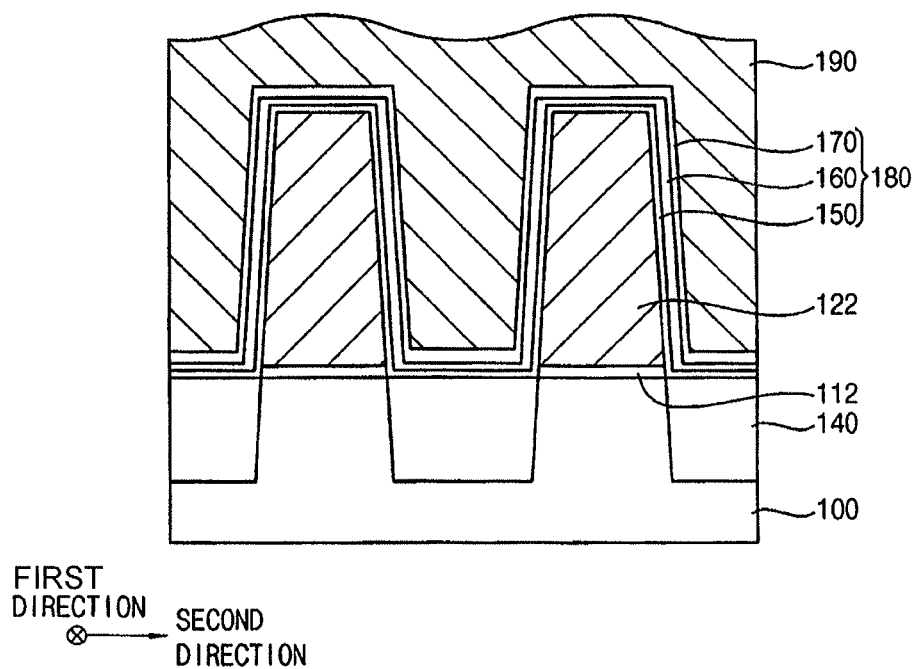

Referring to FIG. 7, a control gate layer 190 may be formed on the dielectric layer 180. The control gate layer 190 may be formed using doped polysilicon, a metal, a metal nitride, a metal silicide, and/or the like. In an example embodiment, the control gate 190 may be formed to have a doped polysilicon layer, an ohmic layer, a diffusion barrier layer, an amorphous layer, and/or a metal layer sequentially stacked. For example, the ohmic layer may include titanium, tantalum, tungsten, molybdenum or an alloy thereof, and the diffusion barrier layer may include tungsten nitride, titanium nitride, tantalum nitride, molybdenum nitride, and the like. For example, the amorphous layer may include a refractory metal silicide, e.g., amorphous tungsten silicide, amorphous titanium silicide, amorphous molybdenum silicide or amorphous tantalum silicide, and the metal layer may include tungsten, titanium, tantalum, molybdenum or an alloy thereof.

Referring to FIGS. 1 and 2 again, a second mask (not illustrated) may be formed on the control gate layer 190. In example embodiments, a plurality of second masks may be formed along the first direction, and each second mask may extend along the second direction. The control gate layer 190, the dielectric layer 180, the preliminary floating gate 122, and the preliminary tunnel insulation layer pattern 112 may be patterned using the second mask as an etching mask. Thus, the gate structure 205 including the tunnel insulation layer pattern 115, the floating gate 125, the dielectric layer pattern 185, and the control gate 195 sequentially stacked on the substrate 100 may be formed. The dielectric layer pattern 185 may have the first oxide layer pattern 155, the nitride layer pattern 165, and the second oxide layer pattern 175 sequentially stacked.

In example embodiments, a plurality of tunnel insulation layer patterns 115 having an island shape with respect to each other may be formed on the active region, and a plurality of floating gates 125 having an island shape with respect to each other may be formed on the active region. In example embodiments, a plurality of dielectric layer patterns 185 may be formed along the first direction, and each dielectric layer pattern 185 may extend along the second direction. In example embodiments, a plurality of control gates 195 may be formed along the first direction, and each control gate 195 may extend along the second direction.

FIGS. 8 to 15 are cross-sectional views illustrating a method of manufacturing a semiconductor device in accordance with example embodiments. In FIGS. 8 to 15, each of a first region I and a second region II may be a cell region, in which memory cells may be formed, and a third region III may be a peripheral circuit region in which peripheral circuits may be formed. Each of the first and third regions I and III is shown by a cross-sectional view cut along a second direction substantially parallel to a top surface of a substrate 300, and the second region II is shown by a cross-sectional view cut along a first direction substantially perpendicular to the second direction. In the method of manufacturing the semiconductor device, processes for forming the gate structure may be substantially the same as those illustrated with reference to FIGS. 3 to 7. Thus, repetitive with respect to same elements are omitted hereinafter.

Figure 8:
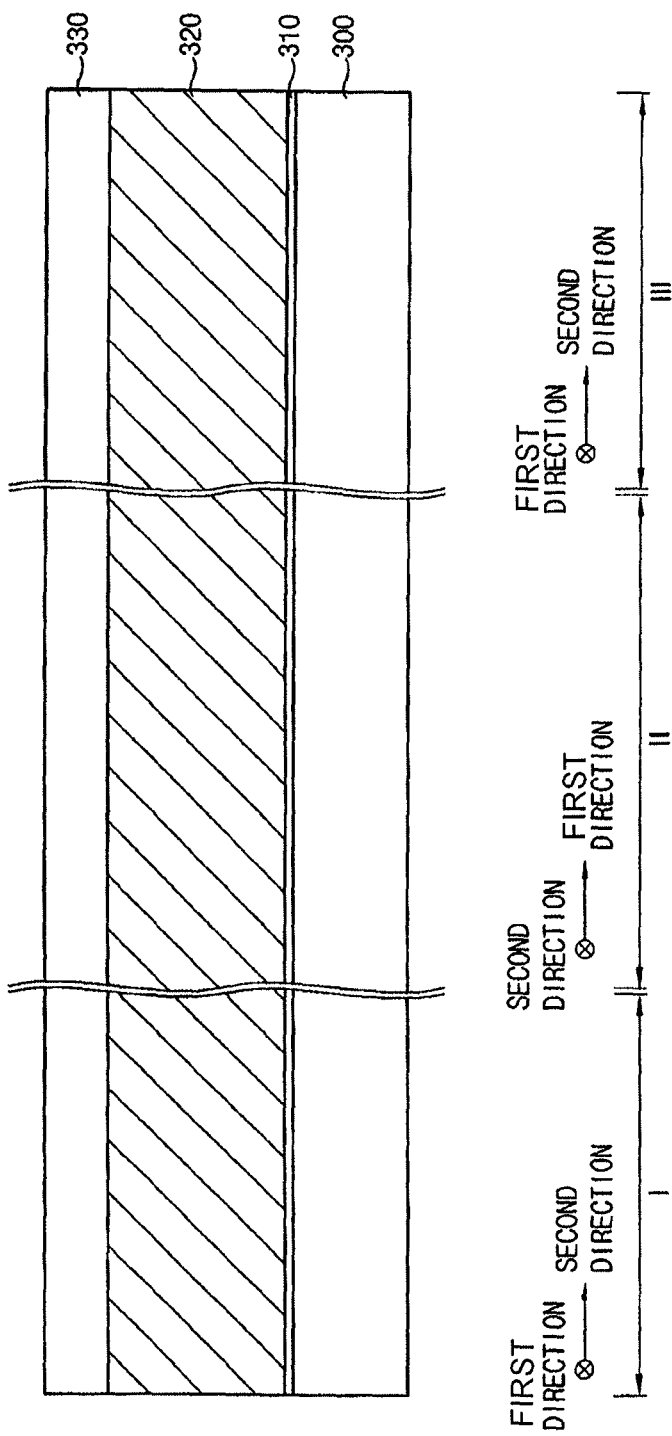
FIGS. 8 to 15 illustrate cross-sectional views of stages in a method of manufacturing a semiconductor device in accordance with example embodiments.

Referring to FIG. 8, a tunnel insulation layer 310, a floating gate layer 320, and a first mask layer 330 may be sequentially formed on the substrate 300.

Figure 9:
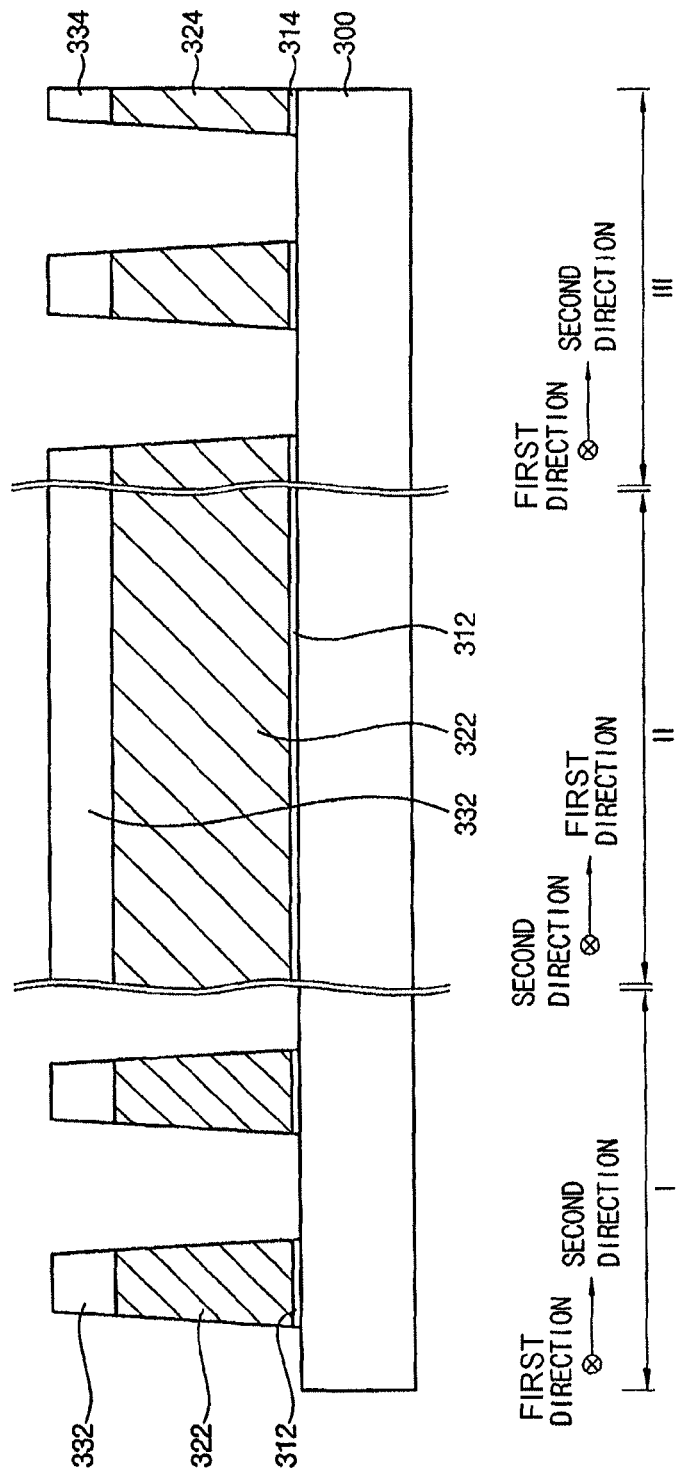

Referring to FIG. 9, the first mask layer 330 may be patterned to form a first mask 332 and a second mask 334 by a photolithography process. In example embodiments, a plurality of first masks 332 may be formed along the second direction, and each first mask 332 may extend along the first direction. In example embodiments, a plurality of second masks 334 having an island shape from each other may be formed.

Portions of the floating gate layer 320 and the tunnel insulation layer 310 may be etched using the first and second masks 332 and 334 as an etching mask. Thus, a first preliminary tunnel insulation layer pattern 312 and a first preliminary floating gate 322 may be formed on portions of the substrate 300 in the first and second regions I and II, and a second preliminary tunnel insulation layer pattern 314 and a second preliminary floating gate 324 may be formed on a portion of the substrate 300 in the third region III.

In example embodiments, a plurality of first preliminary tunnel insulation layer patterns 312 may be formed along the second direction, and each first preliminary tunnel insulation layer pattern 312 may extend along the first direction. In example embodiments, a plurality of first preliminary floating gates 322 may be formed along the second direction, and each first preliminary floating gate 322 may extend along the first direction. In example embodiments, a plurality of second preliminary tunnel insulation layer patterns 314 having an island shape from each other may be formed, and a plurality of second preliminary floating gates 324 having an island shape may be formed.

Figure 10:
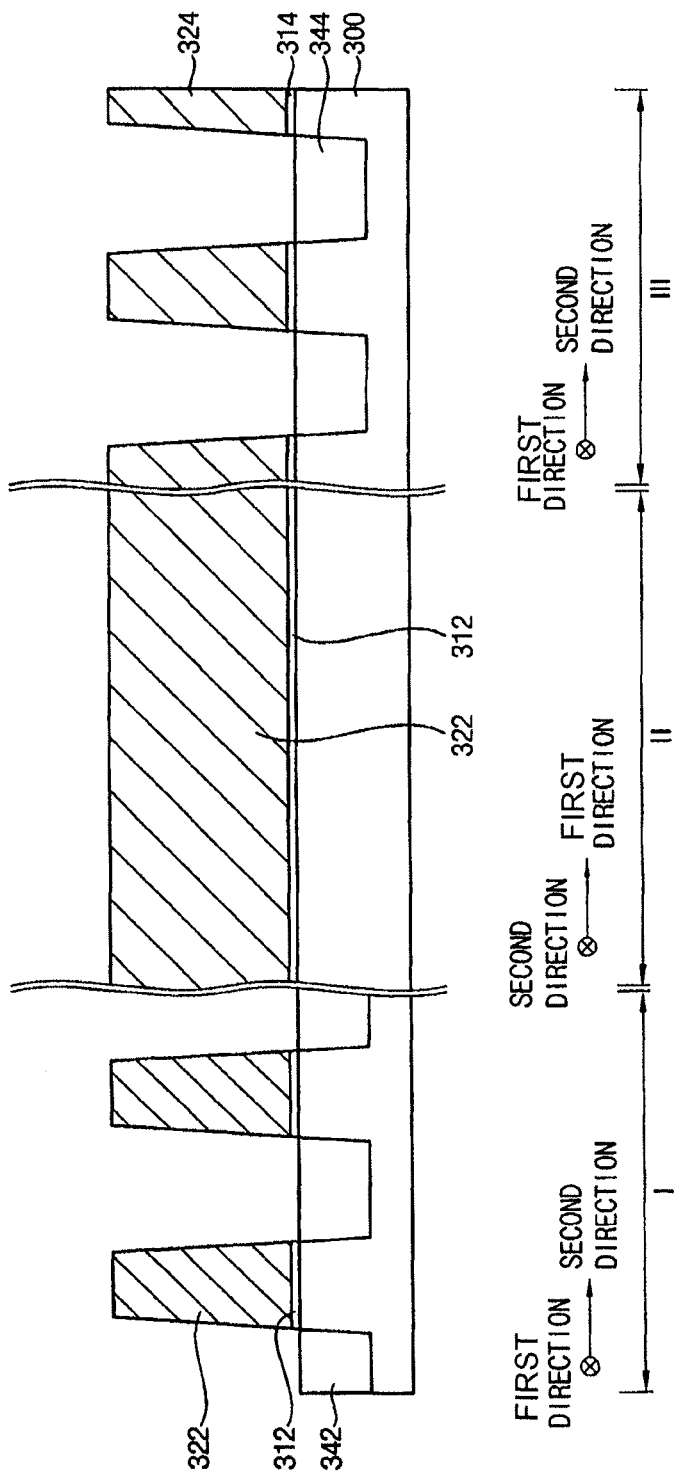

Referring to FIG. 10, upper portions of the substrate 300 may be etched using the masks 332 and 334, the floating gates 322 and 324 and the preliminary tunnel insulation layer patterns 312 and 314 as an etching mask. As a result, a first trench (not illustrated) may be formed on the substrate 300 in the first and second regions I and II, and a second trench (not illustrated) may be formed on the substrate 300 in the third region III. In example embodiments, a plurality of first trenches may be formed along the second direction, and each first trench may extend along the first direction. A first isolation layer 342 and a second isolation layer 344 may be formed to fill the first trench and the second trench respectively.

In example embodiments, an insulation layer may be formed on the substrate 300 and the masks 332 and 334 to fill the trenches and a space between structures each of which may include the first mask 332, the first preliminary floating gate 322 and the first preliminary tunnel insulation layer pattern 312, or the second mask 334, the second preliminary floating gate 324 and the second preliminary tunnel insulation layer pattern 314. The insulation layer may be planarized until the preliminary floating gates 322 and 324 are exposed, and the masks 332 and 334 may be removed. An upper portion of the insulation layer may be removed to form the first and second isolation layers 342 and 344 exposing sidewalls of the preliminary floating gates 322 and 324 and the preliminary tunnel insulation layer patterns 312 and 314. The first isolation layer 342 may be formed on the substrate 300 in the first and second regions I and II, and the second isolation layer 344 may be formed on the substrate 300 in the third region III.

In example embodiments, a plurality of first isolation layers 342 may be formed along the second direction, and each first isolation layer 342 may extend along the first direction.

Thus, a plurality of first field regions or a plurality of first active regions may be formed in the first and second regions I and II along the second direction, and each of the first field region or the first active region may extend along the first direction. In example embodiments, a plurality of second active regions having an island shape from each other may be formed in the third region III.

Figure 11:
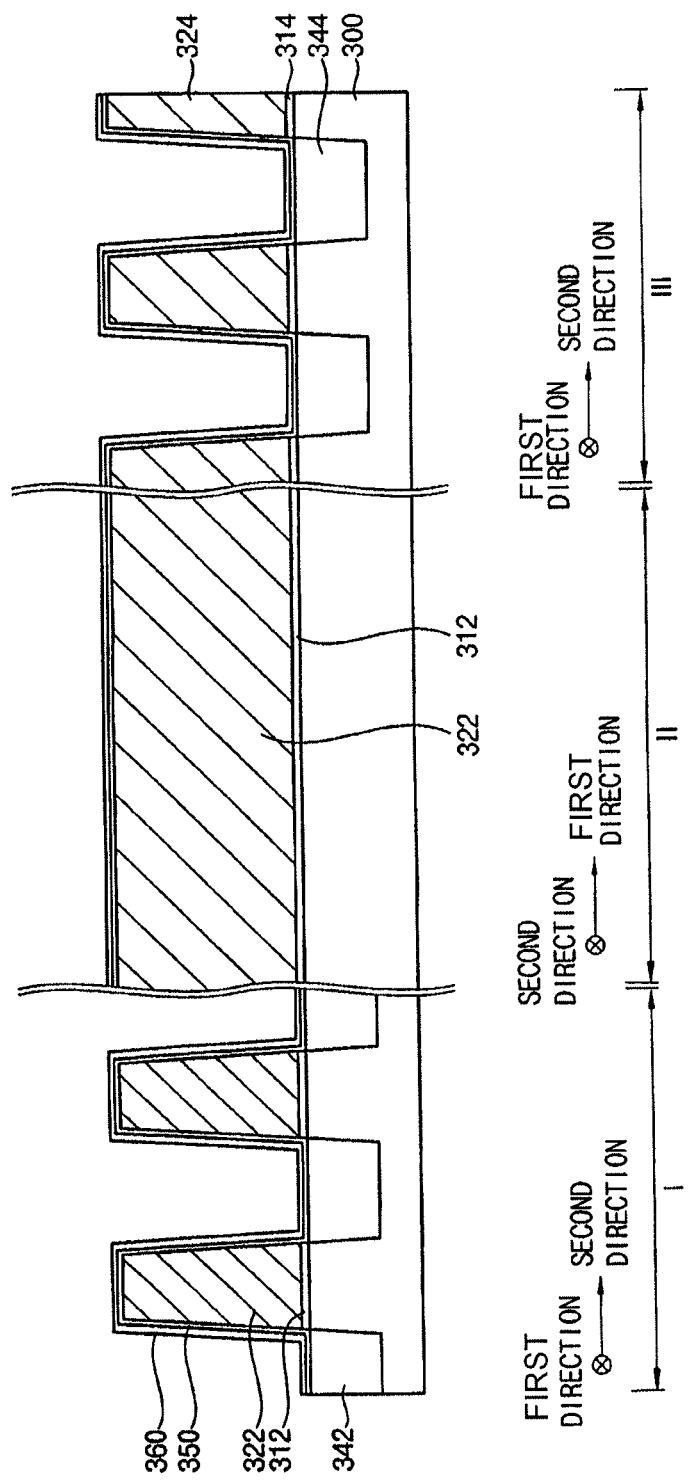

Referring to FIG. 11, a first oxide layer 350 and a nitride layer 360 may be sequentially formed on the substrate 300 and the isolation layers 342 and 344 to cover the preliminary floating gates 322 and 324 and the preliminary tunnel insulation layer patterns 312 and 314.

Figure 12:
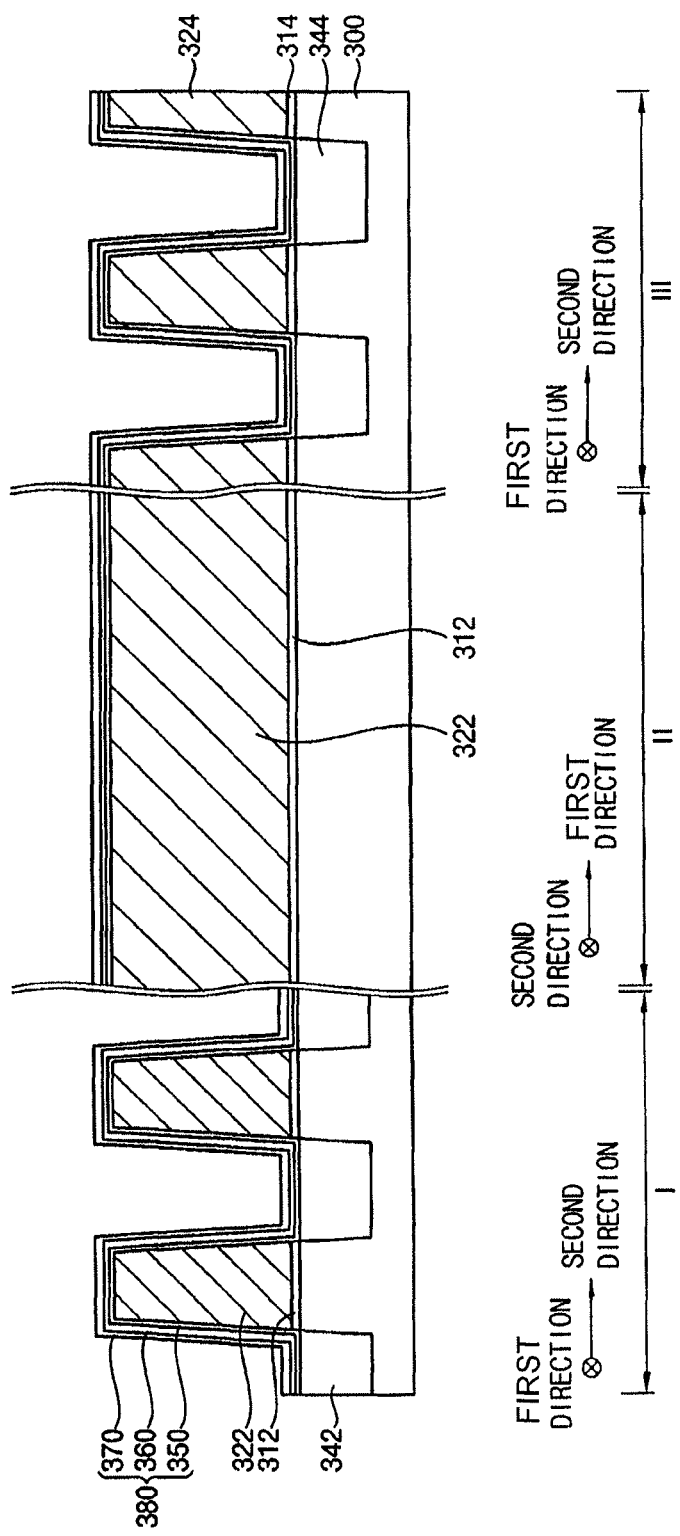

Referring to FIG. 12, a second oxide layer 370 may be formed by an anisotropic plasma oxidation process on the nitride layer 360. Thus, a portion of the nitride layer 360 may be oxidized so that the nitride layer 360 may have a reduced thickness, and the second oxide layer 370 may be formed on the nitride layer 360 to have silicon oxide. A portion of the second oxide layer 370 on top surfaces of the preliminary floating gates 322 and 324 may be formed to have a thickness substantially larger than a portion of the second oxide layer 370 on sidewalls of the preliminary floating gates 322 and 324. A portion of the nitride layer 360 on the top surfaces of the preliminary floating gates 322 and 324 may be formed to have a thickness substantially smaller than a portion of the nitride layer 360 on the sidewalls of the preliminary floating gates 322 and 324. The first oxide layer 350, the nitride layer 360, and the second oxide layer 370 may define a dielectric layer 380.

Figure 13:
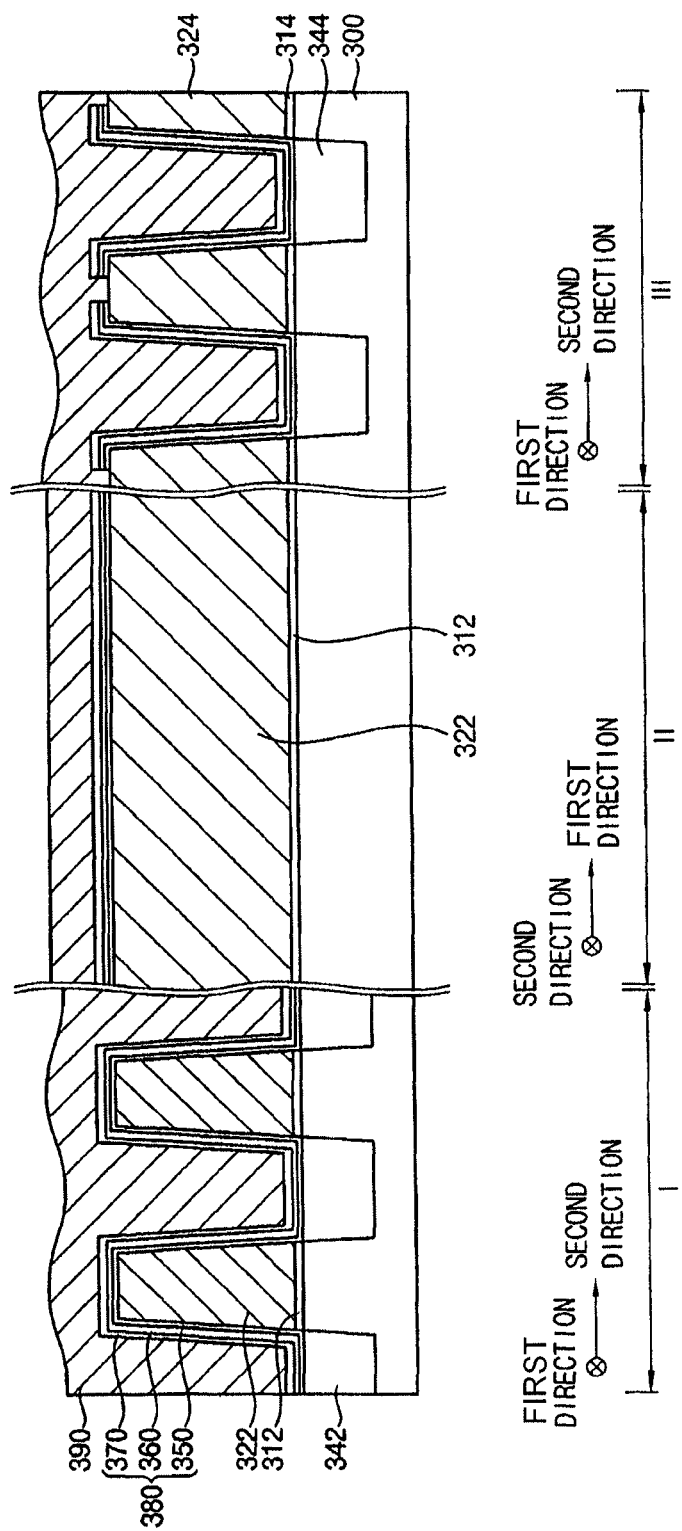

Referring to FIG. 13, a control gate layer 390 may be formed on the dielectric layer 380. In example embodiments, before forming the control gate layer 390, a portion of the dielectric layer 380 on the second preliminary floating gate 324 may be removed to expose a top surface of the second preliminary floating gate 324. Thus, the control gate layer 390 may be formed to make contact with the exposed top surface of the preliminary second floating gate 324.

Figure 14:
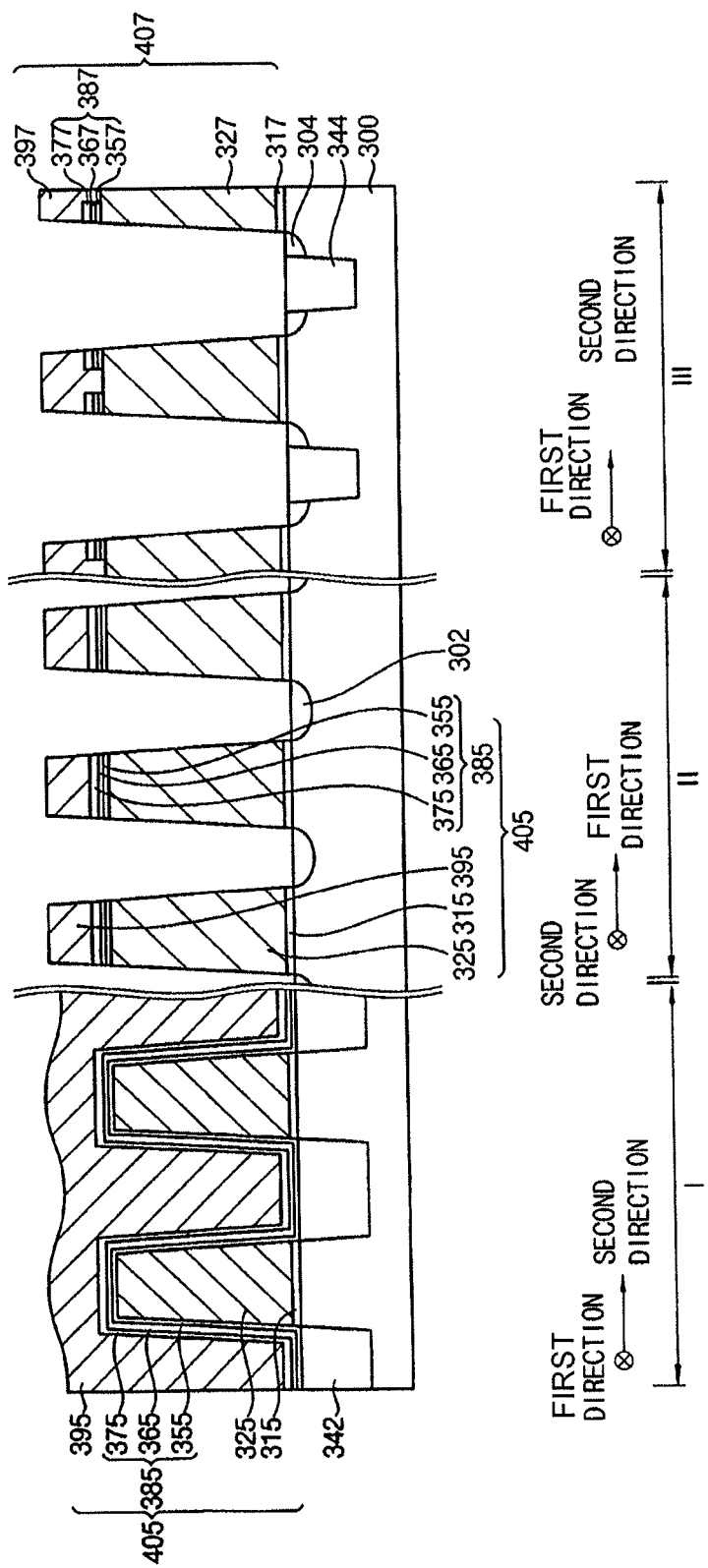

Referring to FIG. 14, a third mask (not illustrated) and a fourth mask (not illustrated) may be formed on the control gate layer 390. Particularly, the third mask may be formed on portions of the control gate layer 390 in the first and second regions I and II, and the fourth mask may be formed on a portion of the control gate layer 390 in the third region III.

In example embodiments, a plurality of third masks may be formed along the first direction, and each third mask may extend along the second direction. In example embodiments, a plurality of fourth masks having an island shape from each other may be formed.

The control gate layer 390, the dielectric layer 380, the preliminary floating gates 322 and 324 and the preliminary tunnel insulation layer patterns 312 and 314 may be patterned using the third and fourth masks as an etching mask. Thus, a first gate structure 405 may be formed on the substrate 300 in the first and second regions I and II, and a second gate structure may be formed on the substrate 300 in the third region III.

The first gate structure 405 may include a first tunnel insulation layer pattern 315, a first floating gate 325, a first dielectric layer pattern 385, and a first control gate 395 sequentially stacked on the substrate 300, and the second gate structure 407 may include a second tunnel insulation layer pattern 317, a second floating gate 327, a second dielectric layer pattern 387, and a second control gate 397 sequentially stacked on the substrate 300. The first dielectric layer pattern 385 may have a first oxide layer pattern 355, a first nitride layer pattern 365, and a second oxide layer pattern 375 sequentially stacked, and the second dielectric layer pattern 387 may have a third oxide layer pattern 357, a second nitride layer pattern 367 and a fourth oxide layer pattern 377 sequentially stacked.

In example embodiments, a plurality of first tunnel insulation layer patterns 315 having an island shape from each other and a plurality of first floating gates 325 having an island shape from each other may be formed on the first active region. In example embodiments, a plurality of first dielectric layer patterns 385 and a plurality of first control gates 395 may be formed along the first direction, and each of the first dielectric layer patterns 385 and each of the first control gates 395 may extend along the second direction.

In example embodiments, the second tunnel insulation layer pattern 317, the second floating gate 327, the second dielectric layer pattern 387, and the second control gate 397 may be formed on the second active region.

By an ion implantation process, first impurity regions 302 may be formed at upper portions of the substrate 300 in the first and second regions I and II, and second impurity regions 304 may be formed at upper portions of the substrate 300 in the third region III.

A spacer (not illustrated) may be further formed on sidewalls of the first and second gate structures 405 and 407.

Figure 15:
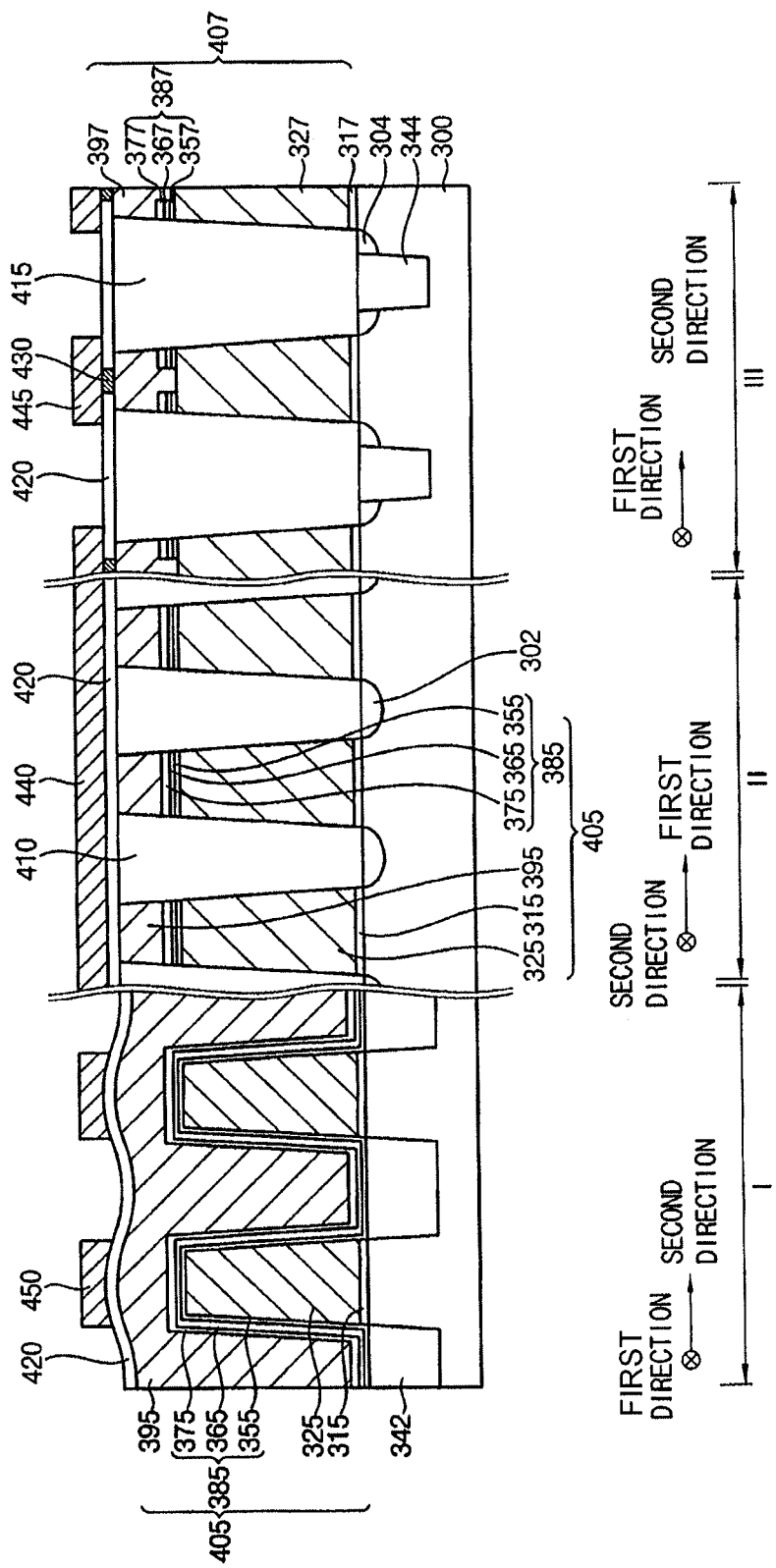

Referring to FIG. 15, an insulating interlayer may be formed on the substrate 300 and the isolation layers 342 and 344 to cover the first and second gate structures 405 and 407 and sufficiently fill spaces therebetween. The insulating interlayer may be planarized until top surfaces of the first and second gate structures 405 and 407 are exposed to form a first insulating interlayer pattern 410 on the substrate 300 in the first and second regions I and II, and a second insulating interlayer pattern 415 on the substrate 300 in the third region III.

A capping layer 420 may be further formed on the first and second gate structures 405 and 407 and the first and second insulating interlayer patterns 410 and 415. Alternatively, instead of forming the capping layer 420, the insulating interlayer may be planarized such that the first and second insulating interlayer patterns 410 and 415 may remain on the first and second gate structures 405 and 407.

A common source line (not illustrated) and a bit line contact (not illustrated) may be formed to make contact with the first impurity regions 302, and a plug 430 may be formed to make contact with a top surface of the second gate structure 407. A conductive layer may be formed on the capping layer 420, the bit line contact and the plug 430, and the conductive layer may be patterned to form a bit line 440 making contact with the bit line contact, and a wiring 445 making contact with the plug 430.

According to example embodiments, a dielectric layer including a first oxide layer/a nitride layer/a second oxide layer on a floating gate may have the second oxide layer formed by an anisotropic plasma oxidation process on the nitride layer. As such, a portion of the second oxide layer on a top surface of the floating gate may be thicker than a portion of the second oxide layer on a sidewall of the floating gate. As a result, an equivalent oxide thickness (EOT) of the dielectric layer may be partially increased on the top surface of the floating gate. Thus, concentration of an electrical field in a top of the floating gate may be prevented or substantially minimized despite a sharp top thereof, i.e., even though the floating gate has a narrow upper portion or a sharp top surface.

In contrast, a conventional floating gate with a gate structure having a sharp upper portion may be have an electric field focused at the sharp upper portion. Accordingly, the electrical characteristics of the gate structure may be deteriorated.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A gate structure, comprising:
a tunnel insulation layer pattern on a substrate;
a floating gate on the tunnel insulation layer pattern;
a dielectric layer pattern on the floating gate, the dielectric layer pattern including:
a first oxide layer pattern,
a nitride layer pattern on the first oxide layer pattern, and
a second oxide layer pattern on the nitride layer pattern, a first portion of the second oxide layer pattern on a top surface of the floating gate having a larger thickness than a second portion of the second oxide layer pattern on a sidewall of the floating gate; and
a control gate on the dielectric layer pattern.

2. The gate structure as claimed in claim 1, wherein a first portion of the nitride layer pattern on the top surface of the floating gate has a smaller thickness than a second portion of the nitride layer pattern on the sidewall of the floating gate, the first portions of the nitride layer and second oxide layer overlapping each other.

3. The gate structure as claimed in claim 2, wherein the floating gate has a smaller top width than a bottom width, the first portion of the second oxide layer pattern overlapping the top width of the floating gate.

4. The gate structure as claimed in claim 2, wherein the second portions of the nitride layer pattern and the second oxide layer pattern cover uniformly the entire sidewalls of the floating gate.

5. The gate structure as claimed in claim 1, wherein the floating gate has a smaller top width than a bottom width, an aspect ratio of the floating gate being about 5:1 or higher.

6. The gate structure as claimed in claim 5, wherein a thickness of the entire dielectric layer is uniform on the top and sidewalls of the floating gate.

7. The gate structure as claimed in claim 1, wherein the dielectric layer includes an equivalent oxide thickness that is larger at the top of the floating gate than at the sidewall thereof.

8. The gate structure as claimed in claim 1, wherein a thickness of the entire first oxide layer pattern is uniform on the top and sidewalls of the floating gate, only the second oxide layer pattern among the first and second oxide layer patterns having different thicknesses on the top and sidewalls of the floating gate.

9. The gate structure as claimed in claim 8, wherein the first oxide layer pattern, the nitride layer pattern, and the second oxide layer pattern are within a same dielectric layer and are stacked in the stated order on the floating gate.

10. The gate structure as claimed in claim 1, wherein the first portion of the second oxide layer pattern is thicker by about 20% to about 40% than the second portion.

* * * * *